(12) United States Patent
Akel

(10) Patent No.: US 9,952,269 B2
(45) Date of Patent: Apr. 24, 2018

(54) MEASUREMENT OF COMPLEX DIELECTRIC CONSTANT AND PERMEABILITY

(71) Applicant: Kerim Akel, Navarre, FL (US)

(72) Inventor: Kerim Akel, Navarre, FL (US)

( * ) Notice: Subject to any disclaimer, the term of this patent is extended or adjusted under 35 U.S.C. 154(b) by 143 days.

(21) Appl. No.: 15/159,803

(22) Filed: May 20, 2016

(65) Prior Publication Data

US 2017/0336452 A1    Nov. 23, 2017

(51) Int. Cl.
*G01R 27/26* (2006.01)
*G01R 27/04* (2006.01)
*G01R 31/12* (2006.01)

(52) U.S. Cl.
CPC ..... *G01R 27/2623* (2013.01); *G01R 27/2617* (2013.01); *G01R 31/12* (2013.01); *G01R 27/2688* (2013.01); *G01R 27/2694* (2013.01)

(58) Field of Classification Search
CPC ........ G01R 27/00; G01R 27/02; G01R 27/04; G01R 27/06; G01R 27/26; G01R 27/2617; G01R 27/2626; G01R 27/2688; G01R 27/2694; G01R 31/00; G01R 31/001; G01R 31/12
USPC ....... 324/600, 629, 631, 637, 638, 649, 658, 324/663, 671, 76.11, 76.12, 76.14
See application file for complete search history.

(56) References Cited

U.S. PATENT DOCUMENTS

| | | | |
|---|---|---|---|
| 2,817,813 A | 12/1957 | Rowen et al. | |
| 5,108,185 A | 4/1992 | Mansuripur et al. | |
| 6,018,391 A * | 1/2000 | Yoshida ................ | G01N 21/94 356/237.4 |
| 6,226,086 B1 * | 5/2001 | Holbrook ........... | G01B 11/0616 356/630 |
| 8,830,556 B2 | 9/2014 | Smith et al. | |
| 2001/0010363 A1 * | 8/2001 | Watanabe ............ | G01B 11/303 250/559.22 |
| 2006/0100490 A1 * | 5/2006 | Wang .................. | A61B 5/0059 600/310 |
| 2007/0103683 A1 * | 5/2007 | Wang .................. | A61B 5/0059 356/364 |
| 2011/0251797 A1 * | 10/2011 | Leger ..................... | G01V 11/00 702/14 |

* cited by examiner

*Primary Examiner* — Hoai-An D Nguyen

(57) ABSTRACT

A method and system of a method of measuring complex dielectric constant and permeability includes directing two polarizations onto a material under test and measuring one or more values of reflection coefficients. Further, the method includes integrating a p-wave reflection coefficient and a s-wave reflection coefficient and calculating, based on the measured one or more values of the reflection coefficients in association with a Brewster's angle, one or more of a complex dielectric constant and permeability.

17 Claims, 8 Drawing Sheets

| $\Gamma_\parallel$ | $\Gamma_\perp$ | Angle |
|---|---|---|
| -0.783+0.025i | -0.788+0.033i | 6 |
| -0.78+0.025i | -0.792+0.032i | 12 |
| -0.774+0.026i | -0.797+0.032i | 18 |
| -0.766+0.026i | -0.804+0.031i | 24 |
| -0.757+0.027i | -0.811+0.03i | 29 |
| -0.755+0.028i | -0.813+0.029i | 30 |
| -0.74+0.029i | -0.824+0.028i | 36 |
| -0.694+0.033i | -0.852+0.024i | 48 |
| -0.678+0.034i | -0.86+0.023i | 51 |
| -0.659+0.036i | -0.869+0.021i | 54 |
| -0.611+0.04i | -0.897+0.019i | 60 |
| -0.496+0.048i | -0.918+0.014i | 69 |
| -0.478+0.049i | -0.922+0.013i | 70 |
| -0.415+0.052i | -0.933+0.011i | 73 |
| -0.07+0.063i | -0.967+0.006i | 82 |
| 0.164+0.061i | -0.979+0.004i | 85 |

FIGURE 7

| $\Gamma_y$ | $\Gamma$ (par.) | Imag. Of intrinsic | Real of intrinsic | x'Y | x'Y | Alpha |
|---|---|---|---|---|---|---|
| -0.783+0.025i | -0.785+0.025i | 5.8633 | 45.63480 | 64.96076 | 16.9885 | 6 |
| -0.780+0.025i | -0.787+0.024i | 5.8543 | 45.62723 | 64.98177 | 16.98347 | 11 |
| -0.781+0.025i | -0.788+0.024i | 5.8634 | 45.62482 | 64.98586 | 16.98386 | 12 |
| -0.775+0.026i | -0.792+0.024i | 5.8561 | 45.64195 | 64.94752 | 16.94538 | 17 |
| -0.774+0.025i | -0.795+0.024i | 5.8556 | 45.64295 | 64.9482 | 16.94294 | 19 |
| -0.766+0.026i | -0.805+0.023i | 5.8599 | 45.63336 | 64.96782 | 16.96361 | 24 |
| -0.757+0.027i | -0.808+0.022i | 5.8659 | 45.63105 | 64.99437 | 16.99217 | 29 |
| -0.753+0.028i | -0.811+0.022i | 5.8705 | 45.60787 | 65.024 | 17.02167 | 30 |
| -0.743+0.029i | -0.811+0.021i | 5.8601 | 45.63229 | 64.9697 | 16.9668 | 35 |
| -0.741+0.029i | -0.821+0.021i | 5.8616 | 45.62996 | 64.97663 | 16.97444 | 36 |
| -0.733+0.030i | -0.827+0.020i | 5.8484 | 45.66004 | 64.90698 | 16.90473 | 39 |
| -0.722+0.031i | -0.834+0.020i | 5.8673 | 45.61580 | 65.00612 | 17.00406 | 42 |
| -0.720+0.031i | -0.834+0.020i | 5.8497 | 45.65701 | 64.91376 | 16.9115 | 46 |
| -0.694+0.033i | -0.851+0.018i | 5.8733 | 45.60113 | 65.03921 | 17.03663 | 48 |
| -0.694+0.033i | -0.851+0.018i | 5.8739 | 45.59939 | 65.04303 | 17.04073 | 49 |
| -0.673+0.034i | -0.856+0.017i | 5.8568 | 45.64001 | 64.95193 | 16.94942 | 51 |
| -0.659+0.036i | -0.866+0.016i | 5.8735 | 45.60384 | 65.03971 | 17.03768 | 54 |
| -0.611+0.040i | -0.885+0.014i | 5.8762 | 45.58984 | 65.06449 | 17.06228 | 60 |
| -0.611+0.040i | -0.885+0.014i | 5.8761 | 45.59990 | 65.06431 | 17.0611 | 62 |
| -0.569+0.043i | -0.899+0.013i | 5.8307 | 45.57844 | 65.09013 | 17.0878 | 64 |
| -0.529+0.046i | -0.909+0.011i | 5.8846 | 45.58467 | 65.07511 | 17.07397 | 67 |
| -0.495+0.048i | -0.911+0.011i | 5.8733 | 45.61531 | 65.0077 | 17.0048 | 69 |
| -0.478+0.049i | -0.922+0.011i | 5.8834 | 45.62080 | 64.99484 | 16.99301 | 70 |
| -0.415+0.052i | -0.931+0.009i | 5.8735 | 45.59541 | 65.03103 | 17.04658 | 73 |
| -0.384+0.056i | -0.943+0.007i | 5.8781 | 45.59416 | 65.05913 | 17.05003 | 76 |
| -0.301+0.058i | -0.947+0.007i | 5.8753 | 45.59416 | 65.05456 | 17.05279 | 77 |
| -0.179+0.061i | -0.959+0.005i | 5.8789 | 45.58585 | 65.07181 | 17.06892 | 80 |
| -0.179+0.061i | -0.959+0.005i | 5.8755 | 45.58917 | 65.06389 | 17.06378 | 80 |
| -0.089+0.063i | -0.967+0.004i | 5.8562 | 45.64057 | 64.95071 | 16.9461 | 82 |
| 0.164+0.061i | -0.979+0.003i | 5.8724 | 45.60401 | 65.03214 | 17.02988 | 85 |
| 0.164+0.061i | -0.979+0.003i | 5.8563 | 45.63145 | 64.97044 | 16.96683 | 85 |
| 0.396+0.053i | -0.987+0.003i | 5.8673 | 45.64763 | 64.93478 | 16.93258 | 87 |

FIGURE 8

MEASUREMENT OF COMPLEX DIELECTRIC CONSTANT AND PERMEABILITY

FIELD OF TECHNOLOGY

The present invention relates to a system and method for measurement of complex dielectric constant and permeability.

BACKGROUND

Current methods used measure macroscopic parameters ($\varepsilon r$ and $\mu r$) include transmission line/reflection line, open-ended coaxial probe, free space, and resonant cavity.

Each of these methods has limitations such as relying on measuring the scattering parameters (S-parameters) which include the reflection coefficient and the transmission coefficient to derive parameters. Further, materials must be handled (introduce additional errors) to arrive at the macroscopic parameters. All the previous methods are plagued with air gaps effect which skew results with an exception of the free space method which must rely on having transmission coefficients. (i.e. the Material Under Test (MUT) must be handled). Also the current free space employed methods are dependent on the incident angles. An error in this angle will yield the wrong result and as such sensitivity charts must be included.

The technique discussed herein does not require handling of any materials and as such it can be used under hostile environment and any temperature. When combining both reflection coefficients from P-wave and s-wave, the angle dependency vanishes. The novel technique disclosed herein mitigates and reduces the common randomness more so than the previously available methods. When the same randomness values are factored, the novel method provides a more accurate answer on the order of tenfold.

SUMMARY

Disclosed are a method, an apparatus and/or a system of measuring a macroscopic parameter.

In one aspect, a method of measuring a macroscopic parameter may include directing two polarizations onto a material under test. One or more values of reflection coefficients are measured. A p-wave reflection coefficient and a s-wave reflection coefficient are integrated. Further, based on the measured one or more values of reflection coefficients in association with a Brewster's angle, one or more macroscopic parameters are calculated.

In another aspect, a method of measuring complex dielectric constant and permeability includes directing two polarizations onto a material under test and measuring reflection coefficients. The reflection coefficients are inputted into an integrated formula which yields the intrinsic impedance of the material. Using electromagnetic laws, as described later, in derived formulas will engender the complex macroscopic parameters of the material. Further, the method includes integrating a p-wave reflection coefficient and a s-wave reflection coefficient and calculating, based on the measured one or more values of the reflection coefficients in association with a Brewster's angle, one or more of a complex dielectric constant and permeability.

Other objects and advantages of the embodiments herein will become readily apparent from the following detailed description taken in conjunction with the accompanying drawings. The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not as limitation in the figures of the accompanying drawings, in which like references indicate similar elements and in which:

FIG. 7 is table depicting Reflection coefficients for oblique angles, according to an example embodiment.

FIG. 8 is table depicting 32 Reflection coefficients with randomness, according to an example embodiment.

Figure 1:
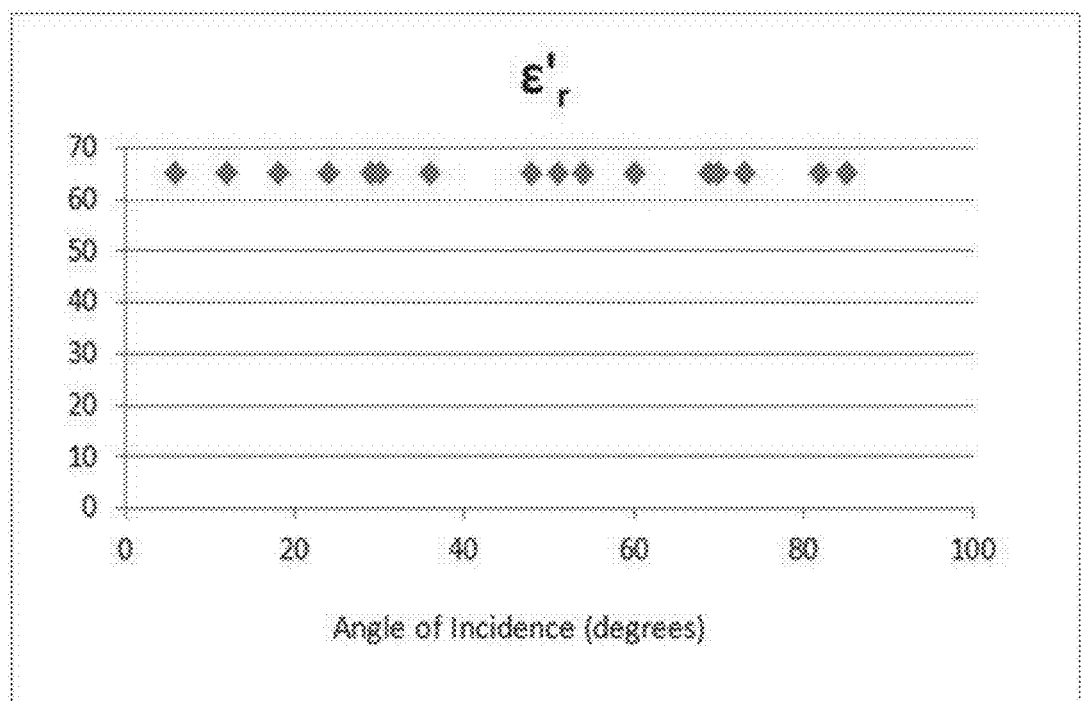
FIG. 1 shows a modeled storage term, according to one or more embodiments.

Other features of the present embodiments will be apparent from the accompanying drawings and from the detailed description that follows.

DETAILED DESCRIPTION

Example embodiments, as described below, may be used to provide a method, an apparatus and/or a system for measuring a macroscopic parameter. More specifically detailed are a system, method and apparatus for measuring a complex dielectric constant and permeability. Although the present embodiments have been described with reference to specific example embodiments, it will be evident that various modifications and changes may be made to these embodiments without departing from the broader spirit and scope of the various embodiments.

There are 4 main techniques employed for measuring the macroscopic parameters of materials. The 4 main techniques are transmission/reflection (TR) line, open-ended coaxial probe, free space and resonant methods. In the 4 main techniques, scattering parameters (S11, S12, S21, S22) must be first computed. Once the scattering parameters or S parameters are known, 4 conversion techniques are used to convert the data to macroscopic parameters of materials.

The conversion techniques may be Nicholson-Ross-Weir (NRW), National Institute of Standards and Technology NIST Iterative, New Non-iterative, and Short circuit line (SCL). For the most part, iterative computations may be the main basis of these conversions techniques. A foundation of all the above methods were developed by Weir [equation 2], where under Transmission Reflection method using the S parameters and material of length l, data is given by $$\mu_r = \frac{1+\Gamma}{\Lambda(1-\Gamma)\sqrt{\frac{1}{\lambda_0^2} - \frac{1}{\lambda_c^2}}} \quad (1)$$

$$\varepsilon_r = \frac{\lambda_0^2}{\mu_r}\left(\frac{1}{\lambda_c^2}\left(\frac{1}{2\pi l}\ln\left(\frac{1}{T}\right)\right)^2\right) \quad (2)$$

Where $$\frac{1}{\Lambda^2} = \left(\frac{\varepsilon_r \mu_r}{\lambda_0^2} - \frac{1}{\lambda_c^2}\right) \quad (3)$$

$$\Gamma = x \pm \sqrt{x^2 - 1} \quad (4)$$

$$x = \frac{S_{11}^2 - S_{21}^2 + 1}{2S_{11}} \quad (5)$$

$$T = \frac{S_{11} + S_{21} - \Gamma}{1 - (S_{11} + S_{21})\Gamma} \quad (6)$$

where Γ and T are reflection and transmission coefficients.

In one or more embodiments, λ0 and λc may be the free space and cut-off wavelengths and ∈r and μr are the relative permittivity and permeability respectively. With older methods, one needs reflection and transmission coefficients first and then solves for roots to get an answer. However, older methods are plagued with handling problems and materials that have a λ/2 in the material. Each of the older methods may be constrained by either handling issues, limitation of the number of macroscopic parameters that can be measured or the use complicated iterative conversion or root finding techniques to get the final results.

In one or more embodiments, a method involves an incidence of 2 types of polarizations from an unbounded medium (air) onto the Material Under Test (MUT). The next step is to measure the complex values of the reflection coefficients.

The measured data of the reflection coefficients (real and imaginary) may be solved to arrive at a macroscopic parameter (keeping in mind the Brewster's angle). After Maxwell's equations may be invoked with the applicable boundary conditions, formulae for S-wave and P-wave reflection coefficients are:

$$\Gamma_\perp \equiv \frac{E_0^r}{E_0^i} = \frac{\eta_2 \cos\theta_i - \eta_1 \cos\theta_t}{\eta_2 \cos\theta_i + \eta_1 \cos\theta_t} = |\Gamma_\perp|e^{j\theta_\perp} \quad (7)$$

$$\Gamma_{//} \equiv \frac{E_0^r}{E_0^i} = \frac{\eta_2 \cos\theta_t - \eta_1 \cos\theta_i}{\eta_2 \cos\theta_t + \eta_1 \cos\theta_i} = |\Gamma_{//}|e^{j\theta_{//}} \quad (8)$$

where η1 and η2 are the intrinsic impedance of medium 1 and medium 2 and θi and θt are angles of incidence and refraction.

In one or more embodiments, a refracted angle and cosine of the angle may be real when the material is lossless and complex when the material is lossy. Snell's law applies to all types of polarizations. Unlike ellipsometry where a MUT must be initially handled, or the refracted angle or a study of shift in polarization must be done, the disclosed method demands neither and incorporates an integration of reflection coefficients from S and P waves. The reflection coefficients may be collected under hostile environment and under different temperature regime. Since the cosine of the refracted angle is the same for both types of polarizations, one can eliminate that term by combining the two types of polarizations in equations (7) and (8). Solving for η2:

$$\eta_2 = \eta_0 \sqrt{\frac{(\Gamma_\perp \Gamma_{//} + 1) + (\Gamma_{//} + \Gamma_\perp)}{(\Gamma_\perp \Gamma_{//} + 1) - (\Gamma_{//} + \Gamma_\perp)}} \quad (9)$$

$$\eta_0 \sqrt{\frac{(\Gamma_\perp \Gamma_{//} + 1) + (\Gamma_{//} + \Gamma_\perp)}{(\Gamma_\perp \Gamma_{//} + 1) - (\Gamma_{//} + \Gamma_\perp)}} = A + jB \quad (10)$$

where constant A and B are the real and imaginary terms resulting from incorporating the reflection coefficients from the two types of polarizations. Invoking Maxwell's equations and Snell's law we get:

$$\tan^{-1}\left(\frac{\mu_r''}{\mu_r'}\right) - \tan^{-1}\left(\frac{\varepsilon_r''}{\varepsilon_r'}\right) = 2\tan^{-1}\left(\frac{B}{A}\right) \quad (11)$$

$$\sqrt{A^2 + B^2} = \eta_0 \sqrt{\frac{\mu_r'}{\varepsilon_r'}}\left[1 + \left(\frac{\mu_r''}{\mu_r'}\right)^2\right]^{1/4}\left[1 + \left(\frac{\varepsilon_r''}{\varepsilon_r'}\right)^2\right]^{1/4} \quad (12)$$

where η0 is the intrinsic impedance of free space. If the material is magnetic, then Brewster angle will exist even for the S-wave (perpendicular case) and 2 additional equations arrived at are:

$$\sin^2\theta_{iB\perp} = \frac{1 - \left(\frac{\varepsilon_r' - j\varepsilon_r''}{\mu_r' - j\mu_r''}\right)}{1 - \left(\frac{1}{\mu_r' - j\mu_r''}\right)^2} \quad (13)$$

$$\sin^2\theta_{iB//} = \frac{1 - \left(\frac{\mu_r' - j\mu_r''}{\varepsilon_r' - j\varepsilon_r''}\right)}{1 - \left(\frac{1}{\varepsilon_r' - j\varepsilon_r''}\right)^2} \quad (14)$$

where $\theta_{iB\perp}$ and $\theta_{iB//}$ are S and P wave Brewster angles.

Using equations (11), (12), (13) and (14), the 4 macroscopic parameters may be mathematically evaluated. If the material is non-magnetic (μr=1), then the above equations reduce to the following matrix format:

$$\begin{pmatrix}\varepsilon_r'\\ \varepsilon_r''\end{pmatrix} = \begin{pmatrix}\frac{\eta_0^2}{A^2+B^2} & 0\\ 0 & \frac{\eta_0^2 \tan\left(2\tan^{-1}\left(\frac{B}{A}\right)\right)}{A^2+B^2}\end{pmatrix}\begin{pmatrix}\frac{1}{\sqrt{1+\left(\tan\left(2\tan^{-1}\left(\frac{B}{A}\right)\right)\right)^2}}\\ \frac{1}{\sqrt{1+\left(\tan\left(2\tan^{-1}\left(\frac{B}{A}\right)\right)\right)^2}}\end{pmatrix} \quad (15)$$

In one or more embodiments, experiments were done using a Modeling and Simulation software and randomness may be inserted into it. Modeling of a lossy, non-magnetic Material Under Test (MUT) may be chosen to have ∈r'=65, ∈r''=17. A frequency of operation used may be 3 GHz using 1 Watt of incident power for one or more ploarization. The MUT is modeled as an infinite dielectric medium to ensure that all the energy from the reflections may be integrated. The frequency may be be varied and as such different values of these complex parameters may be be arrived at. If an antenna is several wavelengths away from the MUT, a wave is considered a plane wave. Floquet-Bloch periodicity, Perfect Electrical Conductor (PEC) and Perfect Magnetic Conductor (PMC) may be invoked to model for an S-wave (Transverse Electric), a P-wave (Transverse Magnetic) waves and the material.

In one or more embodiments, one or more stipulations may be used: first is to impinge 2 types of polarized waves obliquely on an MUT (i.e. θi≠0). θi being an angle of incidence in degrees. Second is to collect numerous data points under different incident angles to ensure that a sampling is as close as possible to a true sampling distribution of mean.

In an example embodiment, 16 arbitrary angles may initially used. Sixteen points under S-wave and 16 points under P-wave may be obtained. Normal incidence (θi=0) may not be allowed because reflection coefficients for the P-wave and the S-wave will be identical. Also, normal incidence on a MUT that is λ/2 in the material at the frequency of operation may result in a zero reflection coefficient, but not so under oblique incidence.

The 16 reflection coefficients for the P and S waves may be captured as shown in FIG. 7, according to one example embodiment. A Brewster angle for the P-wave is around 83 degrees (reflection coefficient changes sign between 82 and 85 degrees).

Based on the table in FIG. 7, using equations (10) and (15) with the reflection coefficients values obtained in the table of FIG. 7, we arrive at the graph shown in FIG. 1.

FIG. 1 shows a modeled storage term, according to one or more embodiments.

In one or more embodiments, the invention discloses a method and system that is quite accurate and stable. However, the modeling/simulation may assume an infinite plane to ensure that all the energy from a reflection is integrated. In reality, MUT may not be infinite. To test for robustness, randomness may be inserted into initial values of macroscopic parameters. A topology of any material may not be mirror-like, a variability will exist from one measurement to another depending on the aspect angle presented by the material to an incident Electro Magnetic wave. To model for the variability, a randomness of up to ±10% of an actual value of the macroscopic parameters may be inserted into the initial conditions. Through central limit theory, 32 points (Angles selected at random and some are repeated) resulted in a mean of 65.005 for the storage term and 17.003 for the loss term. Using a 99% level of confidence, the storage term and loss term $\in'r=(64.98, 65.03)$ and $\in''r=(16.98, 17.03)$ respectively. The generated data is shown in table of FIG. 8.

Figure 5:
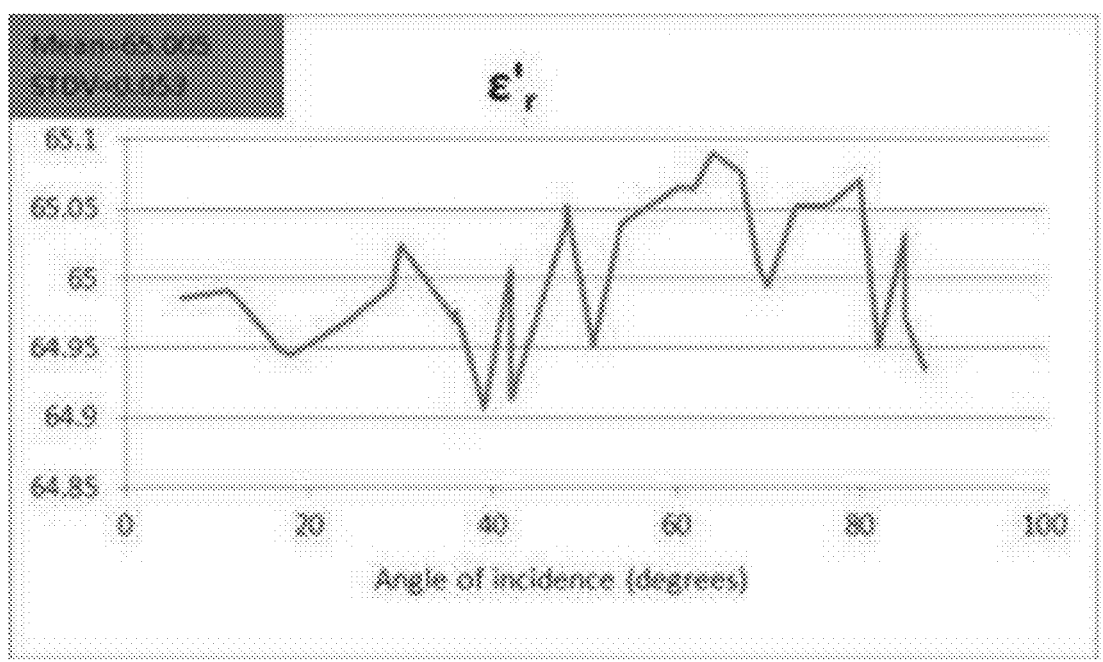
FIG. 5 is a graphical representation of Storage term with ±10% randomness, according to one embodiment.

Using the data from table of FIG. 8 in conjunction with equations (10) and (15) will result in the graph shown in FIG. 5.

FIG. 5 is a graphical representation of Storage term with ±10% randomness, according to one embodiment.

Figure 6:
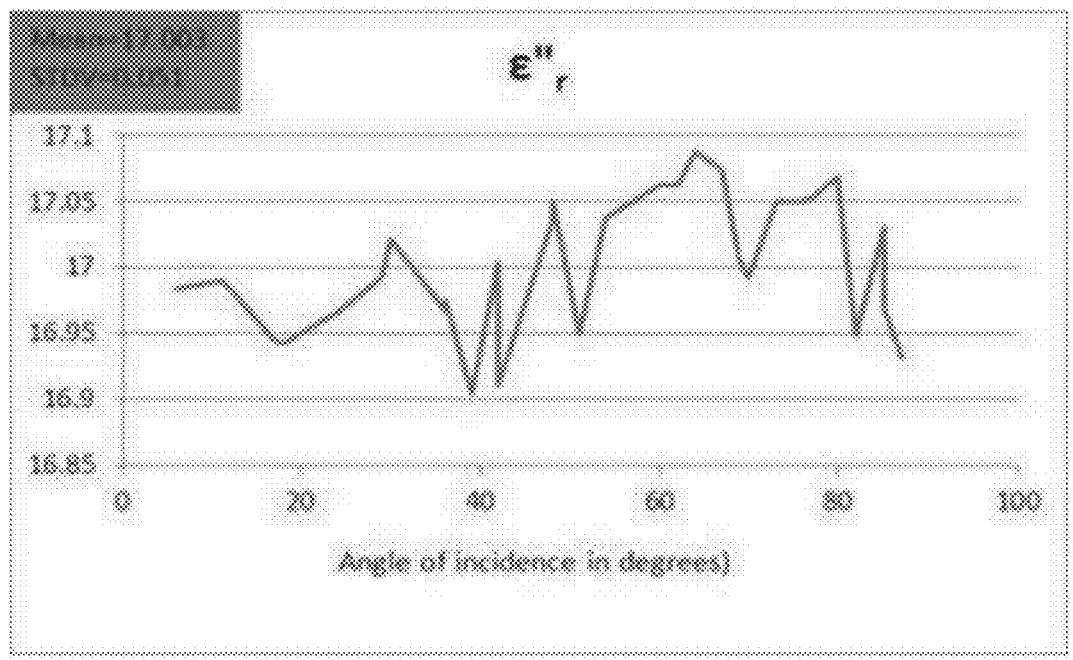
FIG. 6 is a graphical representation of Loss term with ±10% randomness, according to one embodiment.

FIG. 6 is a graphical representation of Loss term with ±10% randomness, according to one embodiment.

In an example embodiment, similar to noise, random nature tends to distribute components over in-phase and quadrature components. Data from reflection coefficients from S and P waves may tend to mitigate the randomness generated by any disturbance. Notwithstanding ±10% randomness injected into the initial values of the macroscopic parameters, the combination of both types of polarization resulted in less than 0.5% error.

FIG. 7 is table depicting Reflection coefficients for oblique angles, according to an example embodiment.

FIG. 8 is table depicting 32 Reflection coefficients with randomness, according to an example embodiment.

In one or more embodiments, two orthogonal polarizations (P-wave & S-wave) may impinge on a material of unknown macroscopic parameters. Values of the two reflection coefficients associated with the P-wave and S-wave may be collected. Plug the two values in a derived formula to yield an intrinsic impedance (A+jB) of the material. Further, using electromagnetic laws may yield the complex macroscopic parameters of the material under test.

Advantages of the method disclosed herein include accuracy and non-reliance on transmission coefficients, roots finding, handling of the MUT or any iterative process.

Further advantages of the method disclosed herein may include no air gaps issues, extremely accuracy, far better in mitigating common randomness and non-dependence of an incident angle when computing the macroscopic parameters.

In one or more embodiments, the method uses two polarizations that are orthogonal to each other. The two polarizations may average out any encountered randomness identical to band pass noise. The method may be used under a host of applications ranging from medical to deep space probing. Once the reflection coefficients are culled, the macroscopic parameters may be computed and a quick comparison between the generated parameters and tabulated macroscopic parameters may be effectively done.

Figure 2:
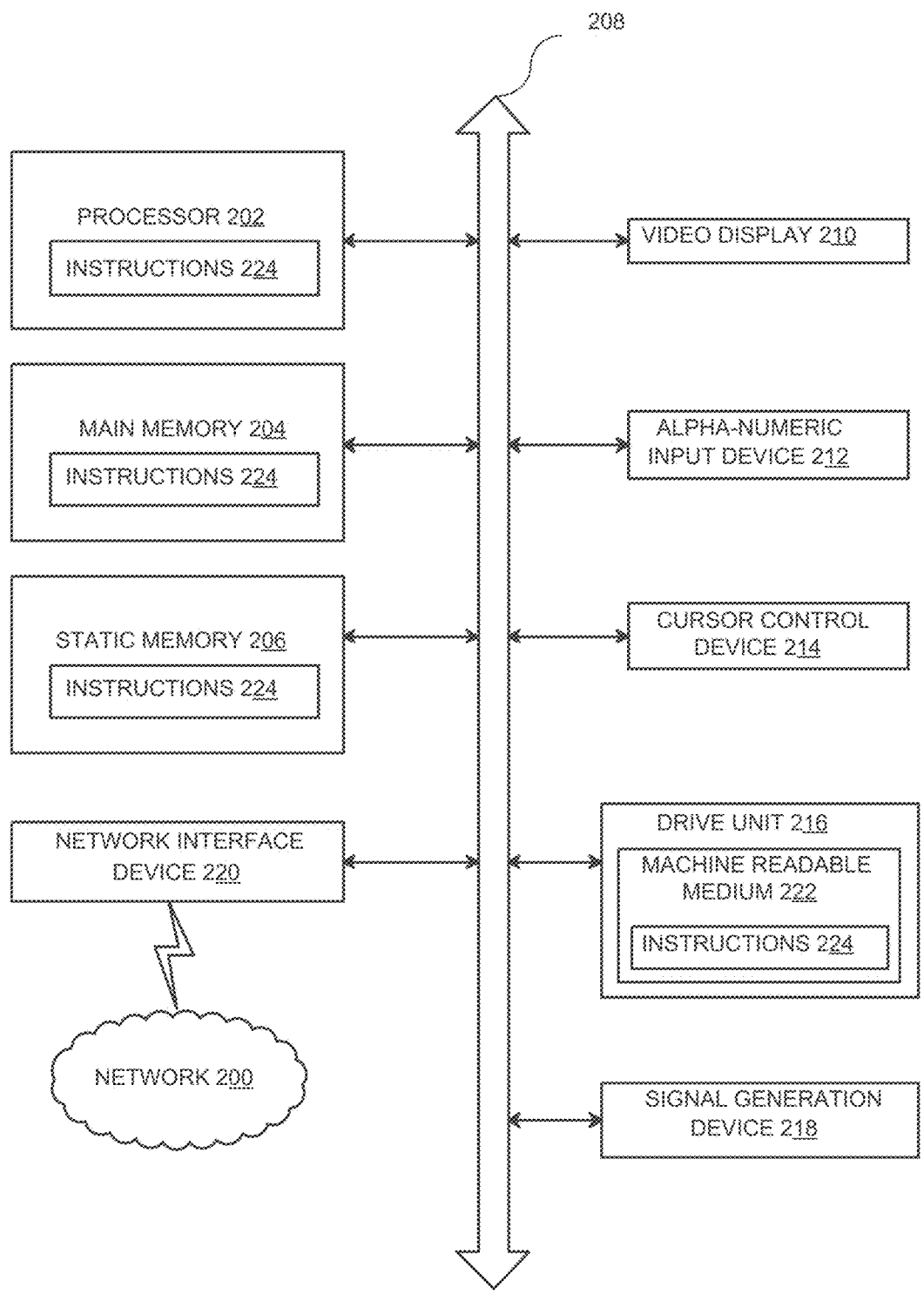
FIG. 2 is a diagrammatic representation of a data processing system capable of processing a set of instructions to perform any one or more of the methodologies herein, according to one embodiment.

FIG. 2 is a diagrammatic representation of a data processing system capable of processing a set of instructions to perform any one or more of the methodologies herein, according to an example embodiment. FIG. 2 shows a diagrammatic representation of machine in the example form of a computer system 200 within which a set of instructions, for causing the machine to perform any one or more of the methodologies discussed herein, may be executed. In various embodiments, the machine operates as a standalone device and/or may be connected (e.g., networked) to other machines.

In a networked deployment, the machine may operate in the capacity of a server and/or a client machine in server-client network environment, and or as a peer machine in a peer-to-peer (or distributed) network environment. The machine may be a personal—computer (PC), a tablet PC, a set-top box (STB), a Personal Digital Assistant (PDA), a cellular telephone, a web appliance, a network router, switch and or bridge, an embedded system and/or any machine capable of executing a set of instructions (sequential and/or otherwise) that specify actions to be taken by that machine. Further, while only a single machine is illustrated, the term "machine" shall also be taken to include any collection of machines that individually and/or jointly execute a set (or multiple sets) of instructions to perform any one and/or more of the methodologies discussed herein.

The example computer system 200 includes a processor 202 (e.g., a central processing unit (CPU) a graphics processing unit (GPU) and/or both), a main memory 204 and a static memory 206, which communicate with each other via a bus 208. The computer system 200 may further include a video display unit 210 (e.g., a liquid crystal displays (LCD) and/or a cathode ray tube (CRT)). The computer system 200 also includes an alphanumeric input device 212 (e.g., a keyboard), a cursor control device 214 (e.g., a mouse), a disk drive unit 216, a signal generation device 218 (e.g., a speaker) and a network interface device 220.

The disk drive unit 216 includes a machine-readable medium 222 on which is stored one or more sets of instructions 224 (e.g., software) embodying any one or more of the methodologies and/or functions described herein. The instructions 224 may also reside, completely and/or at least partially, within the main memory 204 and/or within the processor 202 during execution thereof by the computer system 200, the main memory 204 and the processor 202 also constituting machine-readable media.

The instructions 224 may further be transmitted and/or received over a network 226 via the network interface device 220. While the machine-readable medium 222 is shown in an example embodiment to be a single medium, the term "machine-readable medium" should be taken to include a single medium and/or multiple media (e.g., a centralized and/or distributed database, and/or associated caches and servers) that store the one or more sets of instructions. The term "machine-readable medium" shall also be taken to include any medium that is capable of storing, encoding and/or carrying a set of instructions for execution by the machine and that cause the machine to perform any one or more of the methodologies of the various embodiments. The term "machine-readable medium" shall accordingly be taken to include, but not be limited to, solid-state memories, optical and magnetic media, and carrier wave signals.

Figure 3:
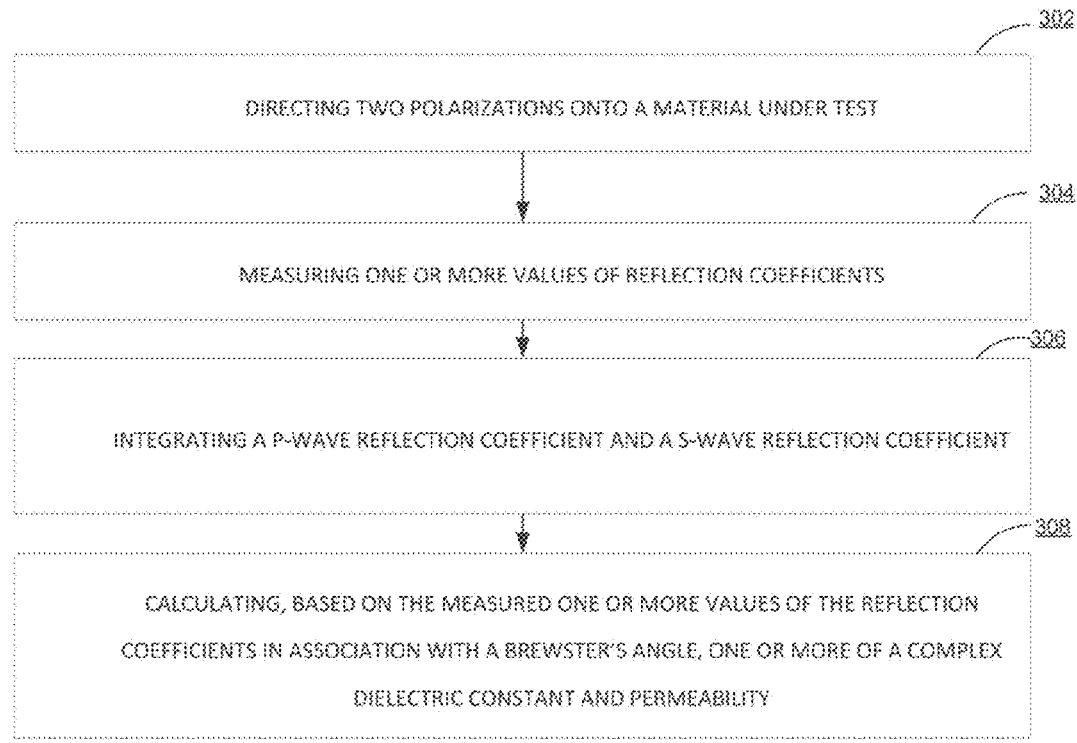
FIG. 3 illustrates a process flow diagram detailing the steps of measuring a macroscopic parameter, according to an embodiment of the present invention.
Figure 4:
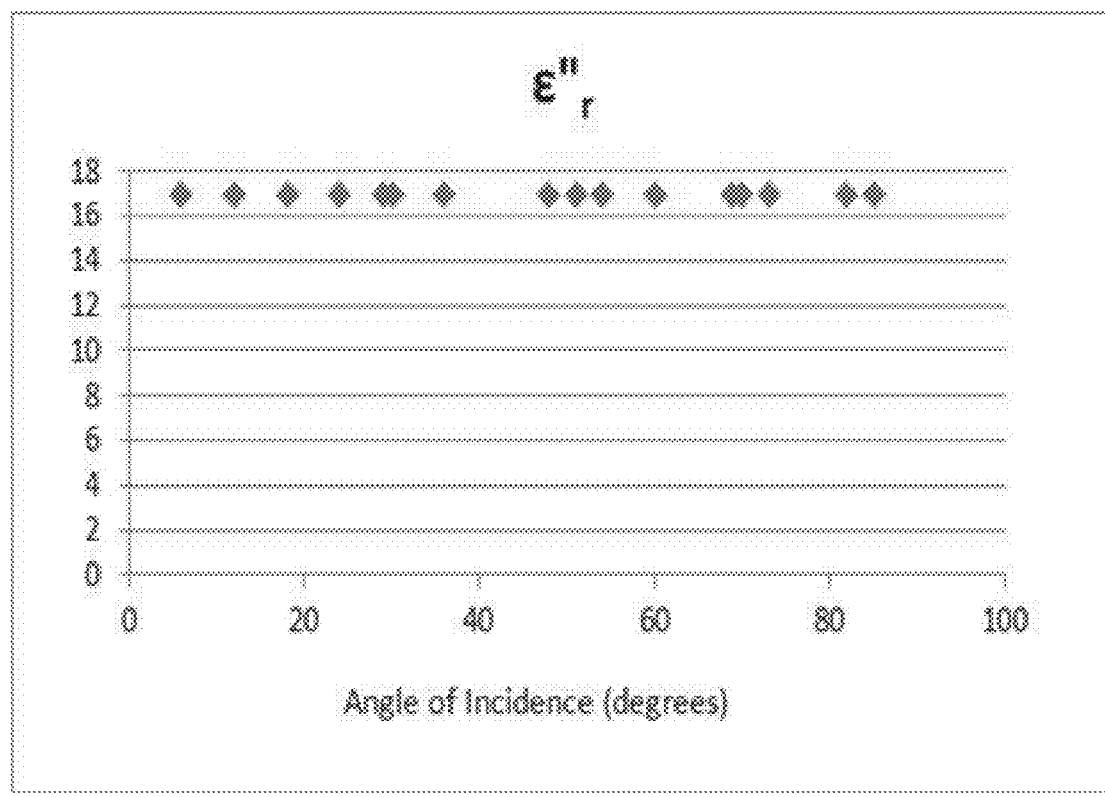
FIG. 4 shows a modeled loss term, according to one or more embodiments.

FIG. 3 illustrates a process flow diagram detailing the steps of measuring a macroscopic parameter, according to an embodiment of the present invention.

In one or more embodiments, a method of measuring a macroscopic parameter may include directing one or polarizations onto a material under test 302. One or more values of reflection coefficients are measured 304. A p-wave reflection coefficient and a s-wave reflection coefficient are integrated 306. Further, based on the measured one or more values of reflection coefficients in association with a Brewster's angle, one or more macroscopic parameters are calculated 308.

In one or more embodiments, the macroscopic parameter is one of a complex dielectric constant and permeability. Polarization may originate from air onto the material under test. The macroscopic parameter may be a physical characteristic associated with the material under test. The one or more values of reflection coefficients may be associated with the p-wave reflection coefficient and the s-wave reflection coefficient. The calculation results may be obtained in a closed form equation. The one or more polarizations may be perpendicular to each other. The p-wave reflection coefficient and the s-wave reflection coefficient may be associated with the one or more values of reflection coefficients.

In one or more embodiments, the complex dielectric constant and permeability are a physical characteristics associated with the material under test.

In one or more embodiments, S-waves, secondary waves, or shear waves (sometimes called an elastic S-wave) may be a type of elastic wave, and are one of the two main types of elastic body waves, so named because they move through the body of an object, unlike surface waves.

In one or more embodiments, P-waves may be a type of body wave, called seismic waves in seismology, that travel through a continuum and are the first waves from an earthquake to arrive at a seismograph. The continuum is made up of gases (as sound waves), liquids, or solids, including the Earth.

In one or more embodiments, a macroscopic property may describe characteristics or behavior of a sample which is large enough to see, handle, manipulate, weigh, etc.

In one or more embodiments, a method of measuring a macroscopic parameter may be extremely accurate when compared to existing methods. Further, the method described herein may not rely on incident angles once the two polarizations are integrated into the formula.

In one or more embodiments, Maxwell's equations are a set of partial differential equations that, together with the Lorentz force law, form the foundation of classical electrodynamics. Maxwell's equations represent one of the most elegant and concise ways to state the fundamentals of electricity and magnetism.

In one or more embodiments, Snell's law a law stating that the ratio of the sines of the angles of incidence and refraction of a wave are constant when it passes between two given media.

In one or more embodiments, other existing methods rely on incident angle and sensitivity charts, the method disclosed herein does not factor any incident angle in its computations. Further, common random variations are natural phenomenon. Existing methods do not mitigate the randomness whereas the novel method and system disclosed herein smoothens out and averages noise thereby reducing randomness resulting in a more robust and exact calculation.

In one or more embodiments, a reflection coefficient is a parameter that describes how much of an electromagnetic wave is reflected by an impedance discontinuity in the transmission medium. It is equal to the ratio of the amplitude of the reflected wave to the incident wave, with each expressed as phasors.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry, firmware, software or any combination of hardware, firmware, and software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

In addition, it will be appreciated that the various operations, processes, and methods disclosed herein may be embodied in a machine-readable medium and/or a machine accessible medium compatible with a data processing system (e.g., a computer devices), and may be performed in any order (e.g., including using means for achieving the various operations). The medium may be, for example, a memory, a transportable medium such as a CD, a DVD, a Blu-ray™ disc, a floppy disk, or a diskette. A computer program embodying the aspects of the exemplary embodiments may be loaded onto the retail portal. The computer program is not limited to specific embodiments discussed above, and may, for example, be implemented in an operating system, an application program, a foreground or background process, a driver, a network stack or any combination thereof. The computer program may be executed on a single computer processor or multiple computer processors.

Accordingly, the specification and drawings are to be regarded in an illustrative rather than a restrictive sense.

What is claimed is:

1. A method of measuring macroscopic parameters comprising:
    directing two polarizations, a P-wave and an S-wave onto a material under test;
    measuring one or more values of reflection coefficients from the two polarizations;
    calculating an impedance associated with the material under test by plugging in the one or more values of reflection coefficients into a derived formula; and
    measuring a macroscopic parameter based on the calculation.

2. The method of claim 1, wherein the macroscopic parameters are physical characteristics associated with the material under test.

3. The method of claim 1, wherein two polarizations originate from air onto the material under test.

4. The method claim 1, wherein the macroscopic parameters are physical characteristics associated with the material under test.

5. The method of claim 1, wherein one or more values of reflection coefficients are associated with the p-wave reflection coefficient and the s-wave reflection coefficient.

6. The method of claim 1, wherein the calculation results in a closed form equation.

7. The method claim 1, wherein the two polarizations are perpendicular to each other.

8. The method of claim 1, wherein the p-wave reflection coefficient and the s-wave reflection coefficient are associated with one or more values of reflection coefficients.

9. A method of measuring complex dielectric constant and permeability comprising: directing two polarizations onto a material under test; measuring the values of reflection coefficients; integrating a p-wave reflection coefficient and a s-wave reflection coefficient into derived formulas; and calculating, based on the measured values of the reflection coefficients in association with a Brewster's angle, the complex dielectric constant and permeability.

10. The method of claim 9, wherein the at least one polarization originates from air onto the material under test.

11. The method claim 9, wherein the complex dielectric constant and permeability are physical characteristics associated with the material under test.

12. The method of claim 9, wherein the calculation results in a closed form equation.

13. The method of claim 9, wherein the p-wave reflection coefficient and the s-wave reflection coefficient are associated with the one or more values of reflection coefficients.

14. The method claim 9, wherein the one or more polarizations are perpendicular to each other.

15. The method of claim 9, further comprising:
smoothening and averaging out any uncontrolled noise to reduce randomness.

16. The method of claim 9, wherein other existing methods rely on the incident angle and sensitivity charts, this new method does not factor the incident angle in its computation resulting in a more robust and accurate result.

17. The method of claim 9, wherein common randomness variations are a natural phenomenon, the existing methods do not mitigate the randomness whereas this method smooth out and averages uncontrolled noise.

* * * * *